United States Patent

Alleman et al.

[15] 3,640,792

[45] Feb. 8, 1972

[54] APPARATUS FOR CHEMICALLY ETCHING SURFACES

[72] Inventors: Raymond Arthur Alleman; William Nelson Henry, both of Lancaster, Pa.

[73] Assignee: RCA Corporation

[22] Filed: Aug. 7, 1970

[21] Appl. No.: 61,976

[52] U.S. Cl. ..............................156/345, 156/17, 118/429, 134/197

[51] Int. Cl. ..............................C23g 3/00, H01l 7/50

[58] Field of Search ..............................156/345, 17; 134/196, 197

[56] References Cited

UNITED STATES PATENTS

| | | | |
|---|---|---|---|
| 2,867,929 | 1/1959 | Monahan | 156/345 |
| 3,139,097 | 6/1964 | Hungerford et al. | 134/145 |
| 3,035,959 | 5/1962 | Wang | 156/17 |

*Primary Examiner*—Jacob H. Steinberg
*Attorney*—Glenn H. Bruestle

[57] ABSTRACT

An apparatus for chemically etching a substantially flat surface of a workpiece such as a semiconductor wafer comprises a vessel containing a fluid etchant, means for producing a toroidal turbulence in the etchant, and a substantially circular, inverted, conical deflecting surface around the workpiece for deflecting falling fluid from the peripheral region of the toroidal turbulence toward the workpiece surface. The central axes of the toroidal turbulence, and the deflecting surface coincide.

4 Claims, 6 Drawing Figures

INVENTORS:
Raymond A. Alleman &
William N. Henry
BY Volker R. Ulbrich
ATTORNEY

APPARATUS FOR CHEMICALLY ETCHING SURFACES

BACKGROUND OF THE INVENTION

The invention relates to apparatus for chemically etching a relatively flat surface of a workpiece and particularly, but not exclusively, for etching a semiconductor wafer to a desired thickness.

Semiconductor array targets for vidicons, such as are described for example in U.S. Pat. No. 3,403,284 to T. M. Buck et al., generally include an N-type silicon wafer on the order of one-half to 1 inch in diameter which has been etched from a thickness of about 5 mils to a thickness of about ⅓ mil. An array of discrete P-type regions is diffused into one surface of the wafer before etching. In operation of the target, the PN-junctions between the P-regions and the N-type bulk are back biased. Light incident on the wafer from the side opposite the P-regions is absorbed and generates minority carriers in the bulk. The minority carriers diffuse to the P-regions and result in a charge pattern in the P-regions which corresponds to the incident light pattern. It is desirable that the target have a uniform thickness on the order or one minority carrier diffusion length, this being approximately ⅓ mil for the silicon bulk. A thicker target results in poor blue response, since minority carriers due to blue light are generated near the light input surface and must diffuse across nearly the entire wafer thickness to reach the PN-junctions. A thinner target results in poor red response, since thin silicon is somewhat transparent for red light. A target of nonuniform thickness yields a nonuniform signal since response to blue and to red light varies from place to place over its surface.

A present method of thinning the wafer includes covering the finished diode side of the wafer with a resist such as wax and immersing the wafer in a beaker of etchant which is rotated while at an angle of approximately 45°. The wafer rolls along the periphery of the rotating beaker and thus has a relatively uniform movement of etchant over the surface to be etched. Such an apparatus is described for instance in U.S. Pat. No. 2,849,296 to A. J. Certa.

One problem with the present etching method is that there is not sufficient uniformity in the finished thickness of the wafer. The etching often proceeds entirely through the wafer in some regions before other regions are as thin as 2/5 mil. A second problem with the present method is that it is difficult to monitor the thickness of the wafer during the etching. Monitoring necessitates stopping the apparatus and removing the wafer from the etchant. A third problem with the present method is that the method is relatively slow, because the speed of rotation which is permitted for the beaker is limited by the tendency of the wafer to be carried along with the wall of the beaker and to cease to roll.

SUMMARY OF THE INVENTION

The novel apparatus comprises a vessel for containing a fluid etchant in which the workpiece surface is immersed, means for producing a generally toroidal turbulence in the etchant, and a deflecting surface around the workpiece surface for deflecting etchant toward the workpiece surface.

The novel apparatus results in etched surfaces of high uniformity. Silicon vidicon targets, for instance, may be etched to a thickness on the order of ⅓ mil to within a 30 percent error over the entire area being etched, thus permitting fabrication of such targets with a substantially uniform color response. The apparatus may be designed to have light transmitted through the workpiece during etching, so that target thickness may be monitored while the etching is proceeding. Also, the turbulence means of the apparatus may be the type resulting in vigorous circulation of the etchant so that the etching process is greatly speeded up without sacrifice of uniformity.

DESCRIPTION OF THE PREFERRED EMBODIMENT

Figure 1:
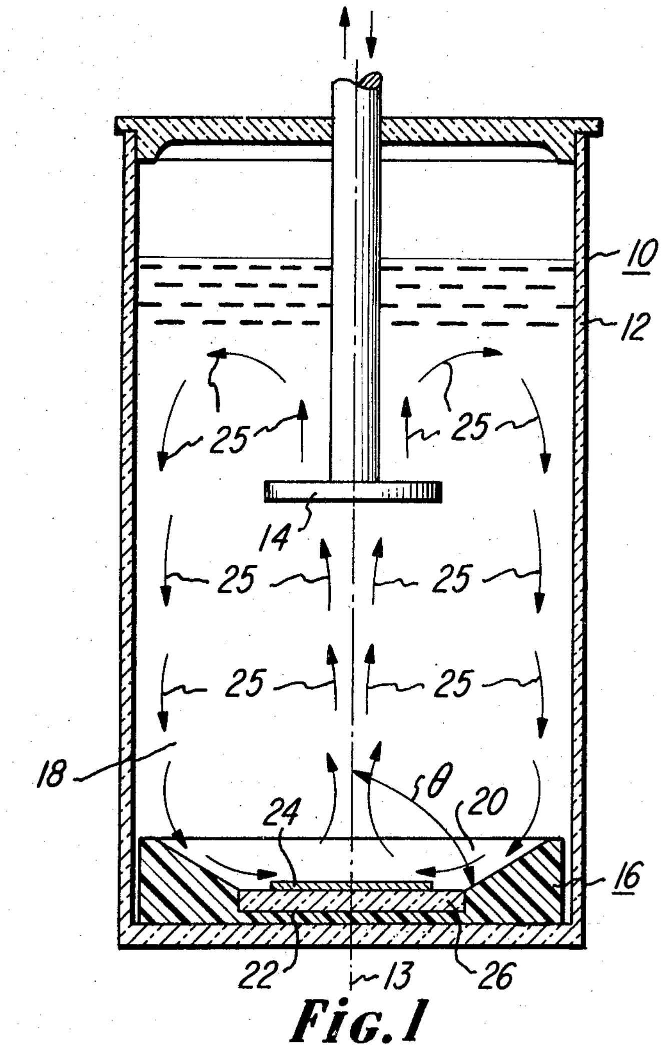
FIG. 1 is a partial section view of the novel apparatus.
Figure 2:
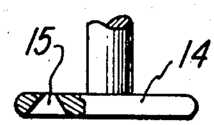
FIG. 2 is a side view of a portion of the impeller of the novel apparatus of FIG. 1 having a cutaway portion to show a detailed feature.
Figure 3:
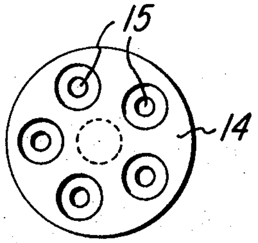
FIG. 3 is a plan view of the impeller of FIG. 2 as seen from the bottom.
Figure 5:
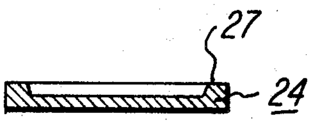
FIG. 5 is a section view of the target of FIG. 1 after etching.
Figure 4:
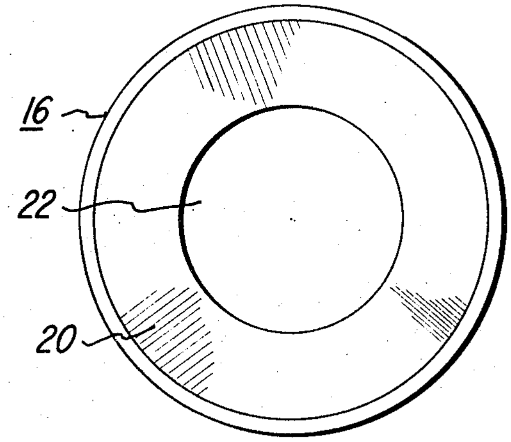
FIG. 4 is a plan view of the top of the deflector of the apparatus of FIG. 1.

In the preferred embodiment of the invention, the novel apparatus is adapted for etching a round silicon vidicon target wafer, having a diameter of about ⅞ inch and a thickness of about 5 mils, to a relatively uniform thickness in the central, major portion on the order of 1/5 mil, with an edge boundary approximately 1/16 inch wide left in the original 5 mil thickness as a supporting rim structure. The apparatus 10, shown in FIG. 1, includes a vessel 12 having a central axis 13, an impeller 14, and a deflector 16, for containing a liquid etchant 18. The vessel 12 is a round polyvinyl chloride cylinder 11 inches tall with inside diameter 3 inches and walls 1/16 inch thick. The impeller 14, also shown in FIGS. 2 and 3, is a polyvinyl chloride disc provided with a series of tapered openings 15 located in a circle around the central axis 13. A shaft attached to the impeller 14 is connected to a driving apparatus (not shown) for oscillating the impeller 14 along the central axis 13 of the vessel 12 at a frequency of about 60 Hertz with an amplitude of 1.5 millimeters. The tapered holes in the impeller provide flow of the etchant 18 in an upward direction when the impeller 14 is oscillated. The deflector 16, also shown in FIG. 4, is of tetrafluoroethylene fluorinated ethylpropylene resin, and acid resistant thermoplastic, with a diameter of about 2⅞ inches. It has a shoulder about 3/64 inch wide and a circular, inverted, conical deflecting surface 20. A shallow well 22 of just over 1.5 inches in diameter is provided in the center of the deflector 16. The bottom of the well 22 is perpendicular to the central axis 13 of the vessel 12 and the deflector 16. The angle $\theta$ between the deflecting surface 20 and the central axis 13 is about 60°. The etchant 18 in the vessel 12 is about 800 milliliters of about 40 percent hydrofluoric acid and about 70 percent nitric acid, making up a solution of hydrofluoric and nitric acid in water which is 1.47 mols hydrofluoric and 14.98 mols nitric acid. It is maintained at room temperature. The surface level of the etchant 18 is 5¼ inches above the bottom edge of the deflecting surface 20. The bottom of the impeller 14 is about 2¾ inches above the bottom edge of the deflecting surface 20. A target 24, also shown in FIGS. 1 and 5, is covered with wax on its diode surface and sealed, diode side down, to a glass substrate 26 which fits in the well 22 of the fixture 16. A one-sixteenth inch border 27 of the target 24 is also covered with wax. It is left thick for support. An electrical lamp (not shown) may be provided as a light source directly under the deflector 16 and outside the vessel 12 and a light-sensitive device (also not shown) located above it either outside the vessel 12 of inside the vessel 12 to monitor the thickness of the target 24 during etching in accordance with known techniques as described for instance in U.S. Pat. No. 2,914,690 to J. J. Polkosky.

After the target 24 has been mounted, the substrate 26 is fitted into the wall 22 and the impeller 14 driven with a vibrating means. The impeller 14 circulates the etchant 18 in a toroidal fashion so that the etchant rises in the central region of the vessel 12 and falls in the wall region as shown by the arrows 25. Since the target 24 is located at the bottom of the toroid, the etchant 18 is pumped upward near the central region of the target surface and is deflected from the wall region across the glass substrate 26 and the target 24 by deflecting surface 20 until it again rises in the central portion. The impeller 14 is driven for approximately twenty minutes while the thickness of the target 24 is monitored, until the thickness is on the order of 1/5 mil, then the target 24 and substrate 26 are removed from the etchant 18 and the target 24 rinsed with deionized water. An advantageous feature of the deflector 16 is that upon removal of the target 24 and the deflector 16 from the etchant 18, a pool of etchant 18 is retained to cover the surface of the target 24. This prevents staining of the target 24 on exposure of residual acid and air which may otherwise occur before the rinsing with water.

GENERAL CONSIDERATIONS

Figure 6:
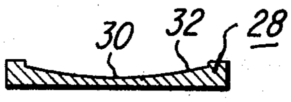
FIG. 6 is a section view of a target etched by the apparatus of FIG. 1.

The apparatus of the preferred embodiment is particularly suited for uniformly etching a flat surface but may be used for etching both convex and concave surfaces. The angle $\theta$ between the surface of the deflecting surface 20 and the central axis of the toroidal turbulence affects the etching rate at various points on the surface of a flat workpiece in a radially symmetrical fashion. It is found that within a range of between about 30° and about 75°, an angle $\theta$ of less than about 60° results in a higher etch rate near the outside perimeter of the workpiece than in the central portion. Thus a workpiece may be etched to have a convex surface. On the other hand, an angle $\theta$ of greater than about 60° results in a uniformly-curved concave surface. Thus, an exceptionally rugged silicon vidicon target 28, as shown in FIG. 6, may be made with a thin central portion 30 for high sensitivity to blue light but with a thicker, peripheral portion 32 which will have decreased sensitivity to blue light but will still give some peripheral resolution to blue light, while providing substantially increased support due to its thickness. While the vessel 12 of the preferred embodiment is a circular cylinder, other vessels may be used so long as a toroidal turbulence is generated by whatever circulating means are used. The degree to which vessel shape is critical depends on the size of the vessel and the size of the workpiece, the primary consideration being that the flow of the etchant over the surface of the deflecting surface be toward the center and generally circularly uniform in a spherical manner. For a very large vessel, a toroidal flow pattern in a central portion may not be greatly affected by the configuration of the vessel walls.

The etchant in the vessel may be varied to suit the various rates of etching which may be desirable for particular substances and is generally applicable to any solid substance etched by liquid. The composition of the etchant is not critical. Impellers such as the one of the preferred embodiment and various modifications which may be made to obtain a particular configuration of turbulence are described for instance in U.S. Pat. No. 2,615,692 and No. 2,681,798, both to H. Mueller. The impeller may be replaced with other means for circulating the etchant in the vessel so long as they result in a toroidal turbulence. The angle between the deflecting surface 20 and the central axis of the toroidal turbulence should be adjusted to suit the various conditions of the apparatus, such as the size of the vessel, the configuration of the impeller, the size of the workpiece, and the dynamic flow properties of the etchant.

We claim:

1. Apparatus for chemically etching a surface of a workpiece, comprising:

a vessel for containing a fluid etchant in which a workpiece surface to be etched is immersed;

means for circulating said etchant in said vessel to produce a generally toroidal turbulence, with said etchant rising in the central region of said turbulence and falling in the peripheral region;

a deflecting surface immersed in said etchant and around said workpiece for deflecting said falling etchant from said peripheral region to said workpiece surface, said deflecting surface being a substantially circular segment of an inverted cone with its central axis coinciding with the central axis of said turbulence, and means for holding said workpiece substantially in the plane of a section through said deflecting surface and perpendicular to the central axis of said toroidal turbulence.

2. The apparatus defined in claim 1 wherein said vessel is a substantially circular cylinder and said means for circulating comprises a relatively inflexible disc immersed in said etchant above said fixture, the central axis of said disc coinciding with said central axis of said turbulence and with the central axis of said vessel, said disc being adapted to pump said etchant in a direction away from said center of said workpiece by oscillation of said disc along said axis of said turbulence.

3. The apparatus defined in claim 1 wherein said conical deflecting surface makes an angle of between 30° and 75° with said central axis of said turbulence.

4. The apparatus defined in claim 3 wherein:

said deflecting surface is an acid resistant thermoplastic surface;

said angle is on the order of 30°, and said etchant is a solution consisting essentially of water, hydrofluoric acid, and nitric acid.

* * * * *